United States Patent
Geng et al.

(10) Patent No.: US 7,868,672 B2
(45) Date of Patent: Jan. 11, 2011

(54) DIGITAL PHASE-LOCKED LOOP WITH TWO-POINT MODULATION AND ADAPTIVE DELAY MATCHING

(75) Inventors: Jifeng Geng, San Diego, CA (US); Gary John Ballantyne, Christchurch (NZ); Daniel F. Filipovic, Solana Beach, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 12/330,885

(22) Filed: Dec. 9, 2008

(65) Prior Publication Data
US 2010/0141313 A1 Jun. 10, 2010

(51) Int. Cl.
*H03L 7/06* (2006.01)
(52) U.S. Cl. ...................................... 327/158; 327/149
(58) Field of Classification Search ................. 327/149, 327/158
See application file for complete search history.

(56) References Cited

U.S. PATENT DOCUMENTS

| | | | | |
|---|---|---|---|---|
| 6,700,447 B1* | 3/2004 | Nilsson | ........................ | 331/10 |
| 6,809,598 B1* | 10/2004 | Staszewski et al. | ........... | 331/16 |
| 7,053,727 B2* | 5/2006 | Nilsson | ........................ | 332/127 |
| 7,403,750 B2* | 7/2008 | Rosnell et al. | ........... | 455/127.4 |
| 7,443,261 B2* | 10/2008 | Yoshikawa et al. | .......... | 332/144 |
| 7,535,311 B2* | 5/2009 | Nergis | .......................... | 332/127 |
| 2004/0192231 A1* | 9/2004 | Grewing et al. | ............. | 455/102 |
| 2004/0192369 A1* | 9/2004 | Nilsson | ........................ | 455/522 |
| 2004/0196924 A1* | 10/2004 | Wilson | ........................ | 375/302 |
| 2005/0286562 A1* | 12/2005 | Nakao et al. | ................. | 370/477 |
| 2007/0165743 A1* | 7/2007 | McCallister | ................. | 375/296 |
| 2007/0205831 A1* | 9/2007 | Yoshikawa et al. | ............ | 331/16 |
| 2008/0129406 A1* | 6/2008 | Nergis | .......................... | 332/127 |
| 2008/0205571 A1* | 8/2008 | Muhammad et al. | ........ | 375/376 |
| 2009/0102564 A1* | 4/2009 | Ballantyne | ................... | 331/10 |
| 2009/0322439 A1* | 12/2009 | Mayer et al. | ................. | 332/118 |
| 2010/0066421 A1* | 3/2010 | Geng et al. | .................. | 327/159 |

* cited by examiner

*Primary Examiner*—Lincoln Donovan
*Assistant Examiner*—Adam D Houston
(74) *Attorney, Agent, or Firm*—Jiayu Xu (57) ABSTRACT

A digital phase-locked loop (DPLL) supporting two-point modulation with adaptive delay matching is described. The DPLL includes highpass and lowpass modulation paths that support wideband and narrowband modulation, respectively, of the frequency and/or phase of an oscillator. The DPLL can adaptively adjust the delay of one modulation path to match the delay of the other modulation path. In one design, the DPLL includes an adaptive delay unit that provides a variable delay for one of the two modulation paths. Within the adaptive delay unit, a delay computation unit determines the variable delay based on a modulating signal applied to the two modulation paths and a phase error signal in the DPLL. An interpolator provides a fractional portion of the variable delay, and a programmable delay unit provides an integer portion of the variable delay.

33 Claims, 8 Drawing Sheets

DIGITAL PHASE-LOCKED LOOP WITH TWO-POINT MODULATION AND ADAPTIVE DELAY MATCHING

BACKGROUND

I. Field

The present disclosure relates generally to electronics, and more specifically to a digital phase-locked loop (DPLL) with two-point modulation.

II. Background

A DPLL is a circuit commonly used to adjust the frequency and/or phase of an oscillator. In one common application, a DPLL may be used to lock the frequency and/or phase of an oscillator to a reference signal having a precise frequency.

In another application, a DPLL may be used to modulate the frequency and/or phase of an oscillator with a modulating signal. If the bandwidth of the modulating signal is much smaller than a closed-loop bandwidth of the DPLL, then the modulating signal may be applied prior to a loop filter within the DPLL. However, if the bandwidth of the modulating signal is wider than the closed-loop bandwidth, then two-point modulation may be performed, and the modulating signal may be applied to two modulation paths in the DPLL. One modulation path may be connected prior to the loop filter and may be used for narrowband modulation. The other modulation path may be connected after the loop filter and may be used for wideband modulation. Two-point modulation may be used to effectively increase the bandwidth of the DPLL, so that the oscillator can be frequency modulated with a wideband modulating signal while minimally disturbing the normal operation of the DPLL. However, the performance of two-point modulation is dependent on the proper gain and delay being applied for each modulation path.

SUMMARY

A DPLL supporting two-point modulation with adaptive delay matching is described herein. The DPLL includes (i) a highpass modulation path that supports wideband modulation of the frequency and/or phase of an oscillator and (ii) a lowpass modulation path that supports narrowband modulation of the frequency and/or phase of the oscillator. The DPLL can adaptively adjust the delay of one modulation path to match the delay of the other modulation path. Adaptive delay matching/adjustment refers to dynamic adjustment of delay based on one or more signals available in the DPLL during normal operation.

In one design, the DPLL may include an adaptive delay unit that can provide a variable delay for one of the two modulation paths. In one design, the adaptive delay unit may include a delay computation unit, an interpolator, and a programmable delay unit. The delay computation unit may determine the variable delay based on a modulating signal applied to the two modulation paths and a phase error signal in the DPLL. The variable delay may be decomposed into (i) an integer portion comprising an integer number of sample periods and (ii) a fractional portion comprising a fraction of one sample period. The interpolator may provide the fractional portion of the variable delay, and the programmable delay unit may provide the integer portion of the variable delay. The DPLL may further include an adaptive scaling unit that can provide a variable gain for the highpass modulation path to match the gain of the lowpass modulation path.

Various aspects and features of the disclosure are described in further detail below.

DETAILED DESCRIPTION

The word "exemplary" is used herein to mean "serving as an example, instance, or illustration." Any design described herein as "exemplary" is not necessarily to be construed as preferred or advantageous over other designs.

Figure 1:
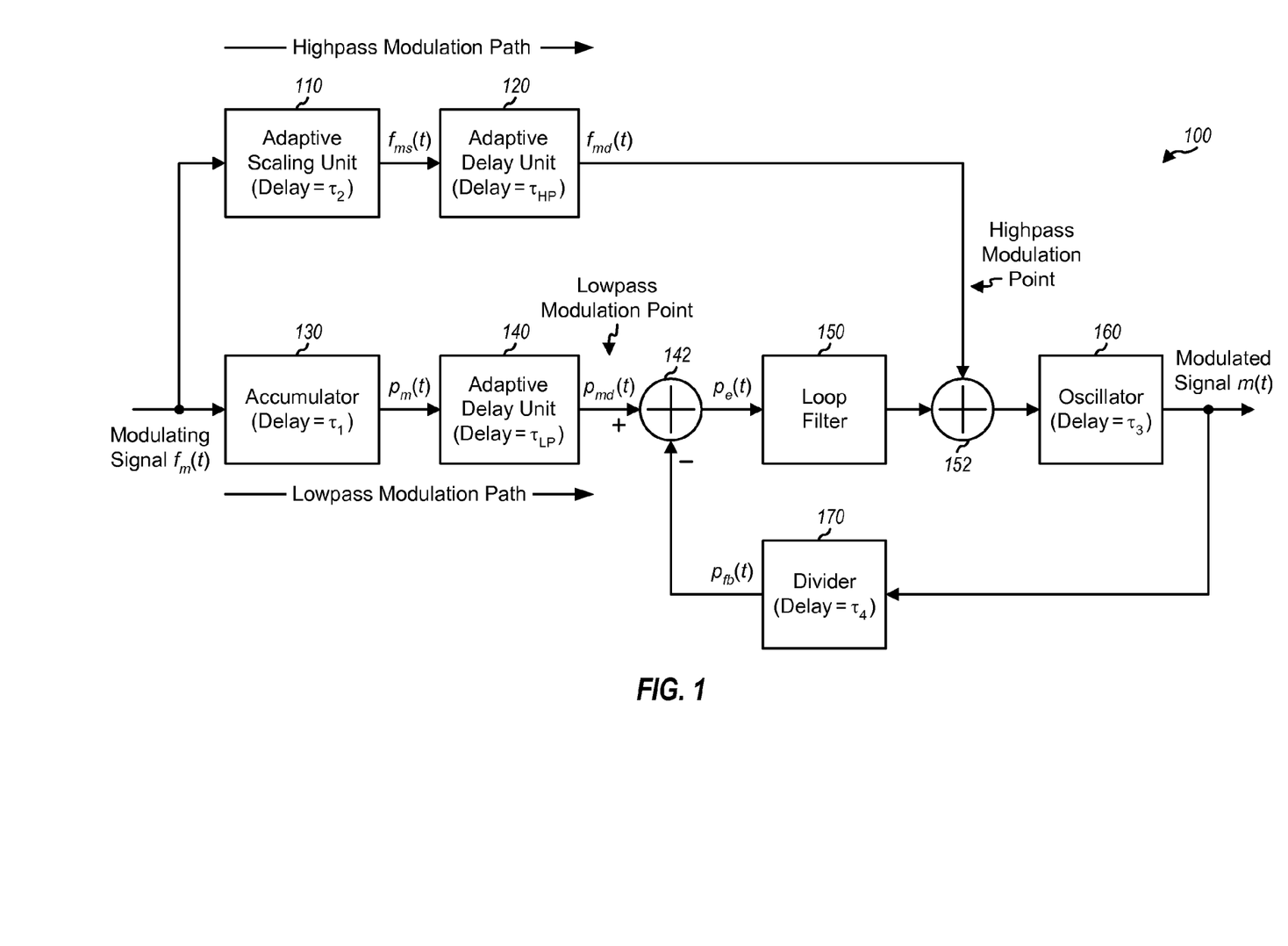
FIG. 1 shows a DPLL with two-point modulation and adaptive delay matching.

FIG. 1 shows a block diagram of a design of a DPLL 100 with two-point modulation and adaptive delay matching. Two-point modulation is also commonly referred to as dual-port modulation. Within DPLL 100, a modulating signal $f_m(t)$ is provided to both a lowpass modulation path and a highpass modulation path. In the highpass modulation path, an adaptive scaling unit 110 scales the modulating signal with a gain and provides a scaled modulating signal $f_{ms}(t)$. An adaptive delay unit 120 delays the scaled modulating signal by a suitable amount and provides a delayed modulating signal $f_{md}(t)$. In the lowpass modulation path, an accumulator 130 accumulates the modulating signal, which converts frequency to phase, and provides a modulating phase signal $p_m(t)$. An adaptive delay unit 140 delays the modulating phase signal by a suitable amount and provides a delayed modulating phase signal $p_{md}(t)$.

A summer 142 subtracts a feedback signal $p_{fb}(t)$ from the delayed modulating phase signal and provides a phase error signal $p_e(t)$. A loop filter 150 filters the phase error signal and provides a filtered phase error signal. Loop filter 150 sets the loop dynamics of DPLL 100 and determines the closed-loop bandwidth, the acquisition time and acquisition range of DPLL 100, the phase noise performance, etc. A summer 152 sums the filtered phase error signal from loop filter 150 and the delayed modulating signal from adaptive delay unit 120 and provides a control signal for an oscillator 160. The control signal adjusts the frequency of oscillator 160 such that the phase of the oscillator follows the phase of the modulation. Oscillator 160 provides a modulated signal m(t) having its frequency modulated by the modulating signal. A divider 170 divides the modulated signal in frequency and provides the feedback signal to summer 142.

FIG. 1 shows adaptive delay unit 120 in the highpass modulation path and adaptive delay unit 140 in the lowpass modulation path. FIG. 1 also shows possible locations where adaptive delay units can be placed in the highpass and lowpass modulation paths. FIG. 1 shows adaptive delay unit 120 being placed after adaptive scaling unit 110 in the highpass modulation path. In general, adaptive delay unit 120 may be placed either before or after adaptive scaling unit 110.

In the design shown in FIG. 1, adaptive delay units may be used in both the highpass and lowpass modulation paths. In another design, just one adaptive delay unit may be used in one modulation path—typically in the modulation path with the shorter delay. This adaptive delay unit can vary the delay of its modulation path to match the delay of the other modulation path. For both designs, the delay matching may allow the effects of the two-point modulation via the highpass and lowpass modulation paths to be canceled at the input of loop filter 150, once DPLL 100 is locked. DPLL 100 may then operate as if the lowpass and highpass modulation are not applied.

As shown in FIG. 1, a modulation point for the lowpass modulation path may be at the input of summer 142, which is prior to loop filter 150. A modulation point for the highpass modulation path may be at the input of summer 152, which is after loop filter 150. The bandwidth of the modulating signal may be determined by the application for which DPLL 100 is used and may be wider than the closed-loop bandwidth of the DPLL. The bandwidth of the lowpass modulation path is determined by loop filter 150 and may be relatively narrow (e.g., less than 100 KHz) in order to achieve the desired noise filtering and loop dynamics. By applying the modulating signal via separate highpass and lowpass modulation paths, DPLL 100 can modulate oscillator 160 with a wider signal bandwidth than the closed-loop bandwidth of the DPLL.

Oscillator 160 may be a digitally controlled oscillator (DCO), a voltage controlled oscillator (VCO), a current controlled oscillator (ICO), a numerically controlled oscillator (NCO), or some other type of oscillator whose frequency can be adjusted by a control signal. Oscillator 160 may operate at a nominal frequency $f_{osc}$, which may be determined by the application for which DPLL 100 is used. For example, DPLL 100 may be used for a wireless communication device, and $f_{osc}$ may be hundreds of megahertz (MHz) or few gigahertz (GHz).

FIG. 1 also shows delays associated with various circuit blocks in DPLL 100. In the lowpass modulation path, accumulator 130 has a delay of $\tau_1$, and adaptive delay unit 140 has a variable delay of $\tau_{LP}$. In the highpass modulation path, scaling unit 110 has a delay of $\tau_2$, and adaptive delay unit 120 has a variable delay of $\tau_{HP}$. Oscillator 160 has a delay of $\tau_3$, and divider 170 has a delay of $\tau_4$. The overall delay $\tau_{HPM}$ from the modulating signal via the highpass modulation path to the input of loop filter 150 may be expressed as:

$$\tau_{HPM} = \tau_2 + \tau_3 + \tau_4 + \tau_{HP}, \quad \text{Eq (1)}$$

where $\tau_{HP}$ may be equal to zero if adaptive delay unit 120 is not present.

The overall delay $\tau_{LPM}$ from the modulating signal via the lowpass modulation path to the input of loop filter 150 may be expressed as:

$$\tau_{LPM} = \tau_1 + \tau_{LP}, \quad \text{Eq (2)}$$

where $\tau_{LP}$ may be equal to zero if adaptive delay unit 140 is not present.

The overall delay of the two modulation paths should match, so that $\tau_{HPM} = \tau_{LPM}$. If only adaptive delay unit 120 is used in the highpass modulation path, then the delay of this unit may be set as follows:

$$\tau_{HP} = \tau_1 - \tau_2 - \tau_3 - \tau_4, \text{ with } \tau_{LP} = 0. \quad \text{Eq (3)}$$

If only adaptive delay unit 140 is used in the lowpass modulation path, then the delay of this unit may be set as follows:

$$\tau_{LP} = \tau_2 + \tau_3 + \tau_4 - \tau_1, \text{ with } \tau_{HP} = 0. \quad \text{Eq (4)}$$

Figure 4:
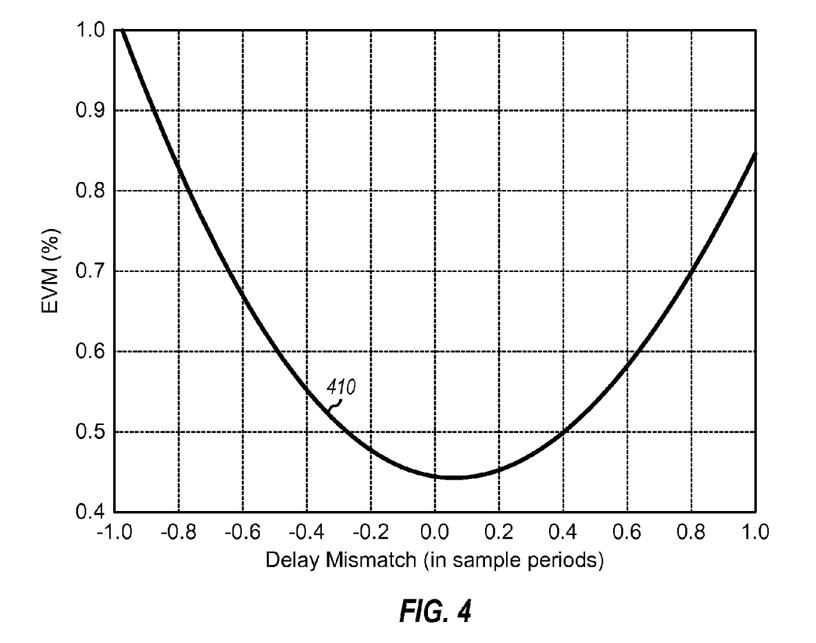
FIG. 4 shows performance degradation versus delay mismatch.

FIG. 4 shows a plot 410 of error vector magnitude (EVM) versus delay mismatch between the highpass and lowpass modulation paths for 8-ary phase shift keying (8-PSK). EVM is commonly used to measure modulation performance. Mismatch is given in units of sample periods for a clock used to update the various digital circuit blocks within the DPLL. For example, a sample period may be equal to 17.4 nanoseconds (ns) for a clock at 57.6 MHz. As shown in FIG. 4, degradation of EVM may be minimal for delay mismatch of less than 0.2 sample periods but may progressively worsen for progressively larger delay mismatch.

Referring back to FIG. 1, the delay $\tau_3$ of oscillator 160 is typically unknown and may be a fraction of a sample period. Adaptive delay unit 120 or 140 may be used to account for the delay of oscillator 160 and may have a resolution of a fraction of a sample period. Adaptive delay unit 120 or 140 may also be used to account for delays of other circuit blocks within DPLL 100.

FIG. 1 shows a model of a DPLL with two-point modulation and adaptive delay matching. The DPLL in FIG. 1 may be implemented with various designs.

Figure 2:
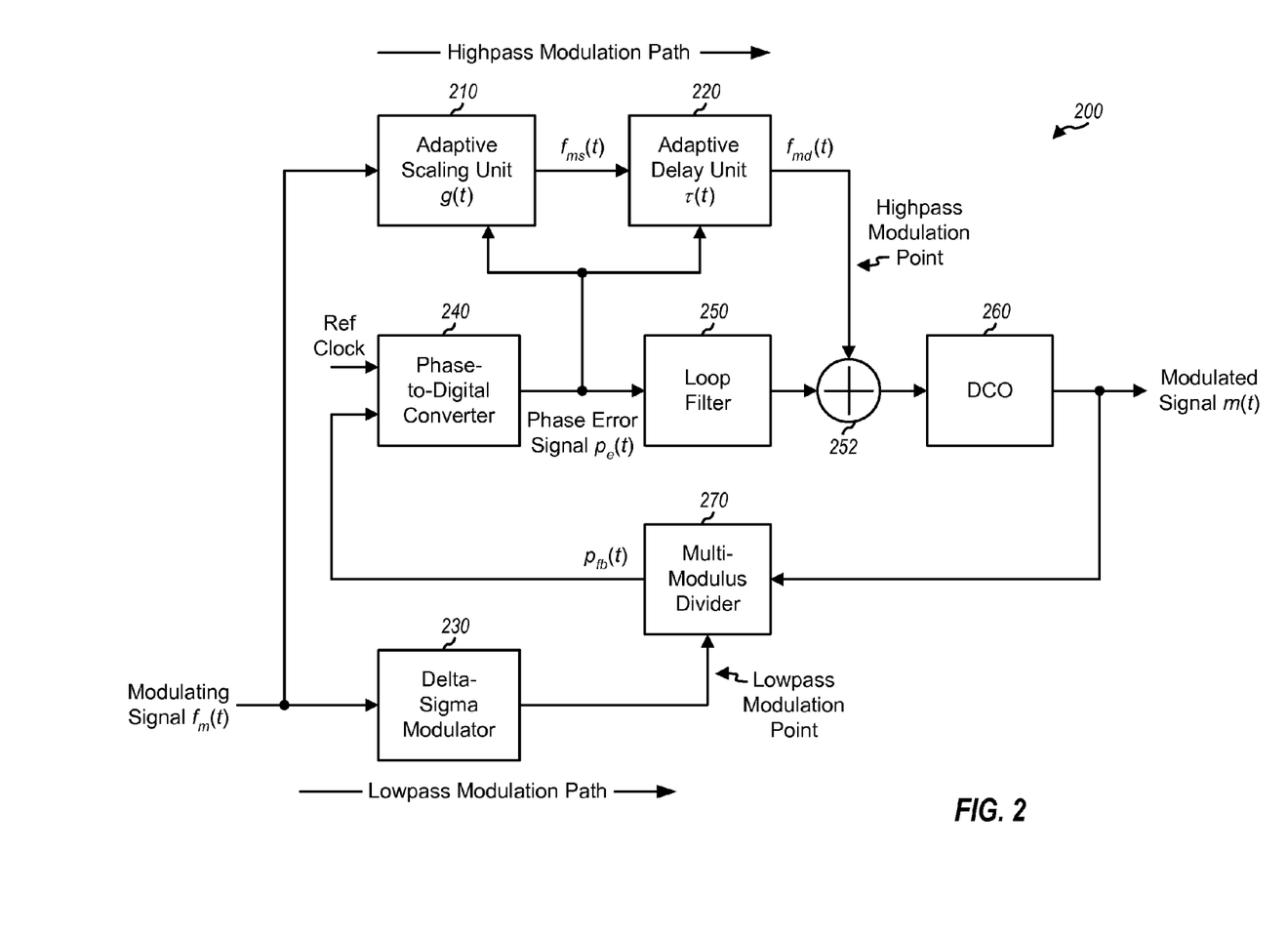
FIGS. 2 and 3 show two DPLLs with two-point modulation and adaptive delay matching.

FIG. 2 shows a block diagram of a design of a DPLL 200 with two-point modulation based on a delta-sigma modulator (DSM) and adaptive delay matching. Within DPLL 200, a modulating signal $f_m(t)$ is provided to both a lowpass modulation path and a highpass modulation path. In the highpass modulation path, an adaptive scaling unit 210 scales the modulating signal with a variable gain g(t) and provides a scaled modulating signal $f_{ms}(t)$. An adaptive delay unit 220 delays the scaled modulating signal by a variable delay $\tau(t)$ and provides a delayed modulating signal $f_{md}(t)$. In the lowpass modulation path, a delta-sigma modulator 230 receives the modulating signal having multiple bits (e.g., 10 or more bits) of resolution at a relatively low input rate and generates a DSM output signal having the same resolution but using one or few bits at a high output rate.

A multi-modulus divider 270 receives a modulated signal m(t) from a DCO 260, divides the modulated signal in frequency by a variable frequency divider factor determined by the DSM output signal, and provides a feedback signal $p_{fb}(t)$. A phase-to-digital converter (PDC) 240 compares the phase of the feedback signal against the phase of a reference (Ref) clock $f_{ref}$ and provides a phase error signal $p_e(t)$. A loop filter 250 filters the phase error signal and provides a filtered phase error signal. A summer 252 sums the filtered phase error signal and the delayed modulating signal from adaptive delay unit 220 and provides a control signal for DCO 260.

Adaptive scaling unit 210 may adaptively vary the gain g(t) for the highpass modulation path based on the modulating signal and the phase error signal, as described below. Adaptive delay unit 220 may adaptively vary the delay $\tau(t)$ for the highpass modulation path based on the scaled modulating signal and the phase error signal, as also described below. In the design shown in FIG. 2, only adaptive delay unit 220 is used in the highpass modulation path, and no adaptive delay units are used in the lowpass modulation path. In another design, adaptive delay unit 220 may be omitted, and an adaptive delay unit may be inserted after phase-to-digital converter 240.

The reference clock may be generated based on a crystal oscillator (XO), a voltage controlled crystal oscillator (VCXO), a temperature compensated crystal oscillator (TCXO), or some other type of oscillator having an accurate frequency. The frequency of the reference clock may be much lower than the frequency of DCO 260. For example, $f_{ref}$ may be tens of MHz whereas $f_{osc}$ may be several GHz.

Figure 3:
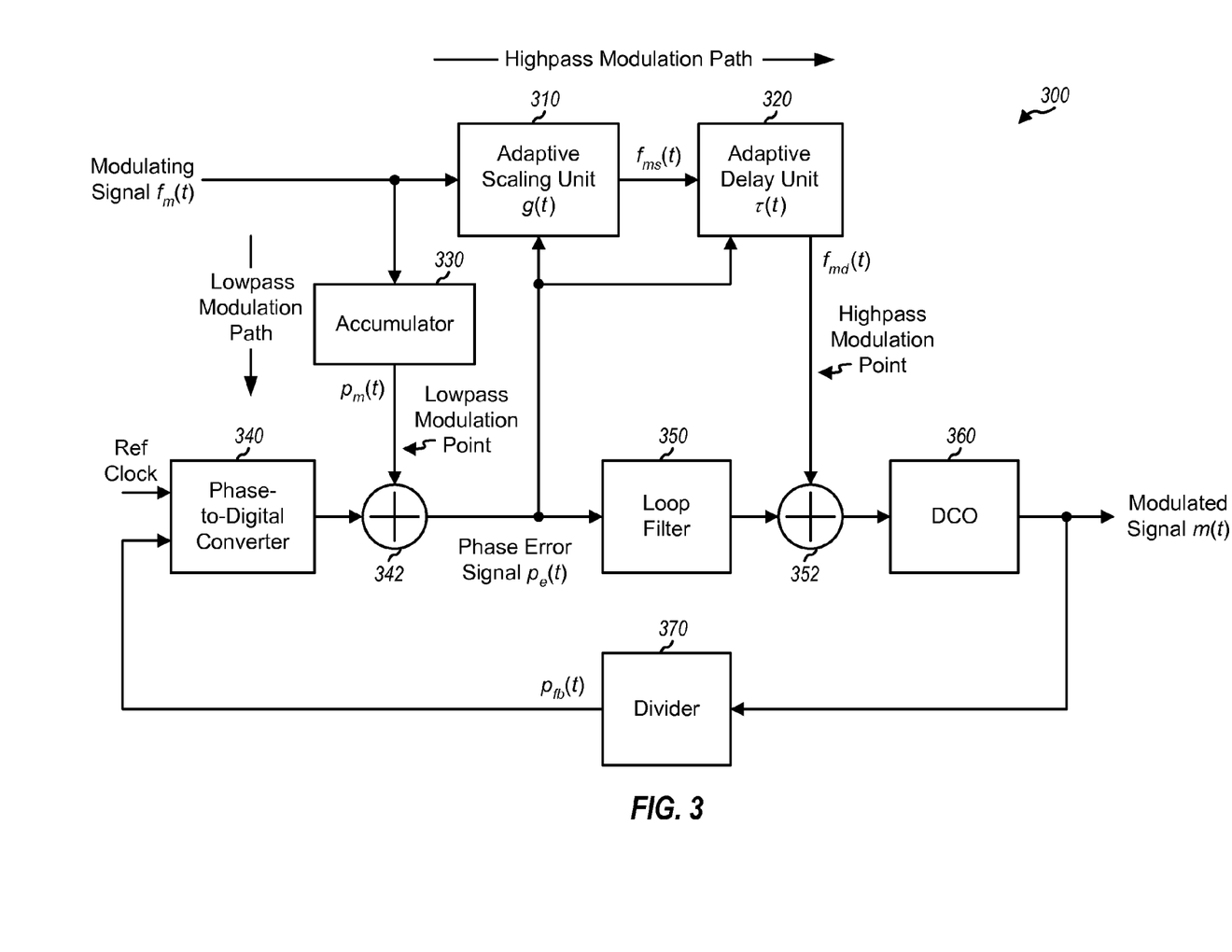

FIG. 3 shows a block diagram of a design of a DPLL 300 with two-point modulation based on an accumulator and adaptive delay matching. Within DPLL 300, a modulating signal $f_m(t)$ is provided to both a lowpass modulation path and a highpass modulation path. In the highpass modulation path, an adaptive scaling unit 310 scales the modulating signal with a variable gain $g(t)$ and provides a scaled modulating signal $f_{ms}(t)$. An adaptive delay unit 320 delays the scaled modulating signal by a variable delay $\tau(t)$ and provides a delayed modulating signal $f_{md}(t)$. In the lowpass modulation path, an accumulator 330 accumulates the modulating signal, which converts frequency to phase, and provides a modulating phase signal $p_m(t)$.

A phase-to-digital converter 340 compares the phase of a feedback signal $f_{fb}(t)$ against the phase of a reference clock $f_{ref}$ and provides a PDC output signal. A summer 342 sums the PDC output signal and the modulating phase signal from accumulator 330 and provides a phase error signal $p_e(t)$. A loop filter 350 filters the phase error signal and provides a filtered phase error signal. A summer 352 sums the filtered phase error signal and the delayed modulating signal from adaptive delay unit 320 and provides a control signal for a DCO 360. A divider 370 receives a modulated signal from DCO 360, divides the modulated signal in frequency by a fixed factor, and provides the feedback signal. The fixed divider factor may be determined based on the oscillation frequency $f_{osc}$ and the reference frequency $f_{ref}$.

Adaptive scaling unit 310 may adaptively vary the gain $g(t)$ for the highpass modulation path, as described below. Adaptive delay unit 320 may adaptively vary the delay $\tau(t)$ for the highpass modulation path, as also described below. In the design shown in FIG. 3, only adaptive delay unit 320 is used in the highpass modulation path, and no adaptive delay units are used in the lowpass modulation path. In another design, adaptive delay unit 320 may be omitted, and an adaptive delay unit may be inserted after accumulator 330.

FIGS. 2 and 3 show two exemplary designs of DPLLs with two-point modulation and adaptive delay matching. A DPLL with two-point modulation and adaptive delay matching may also be implemented with other designs. DPLLs 200 and 300 may be implemented with all or mostly digital circuits. For example, all circuit blocks in FIGS. 2 and 3, possibly except for DCOs 260 and 360, may be implemented with digital circuits. All digital circuit blocks, possibly except for divider 270 and 370, may operate based on a sample clock at a suitable frequency of $f_{samp}$. A signal provided to or by a digital circuit block may thus be composed of a sequence of samples at the sample rate of $f_{samp}$. The digital circuit blocks may be designed to have sufficient bit width and resolution.

For a DPLL with two-point modulation, adaptive delay matching may be performed to match the delays of the two modulation paths. For adaptive delay matching, the delay of one modulation path (e.g., the highpass modulation path in the designs shown in FIGS. 2 and 3) may be adaptively adjusted to account for any delay difference between the two modulation paths (e.g., due to fluctuations in the delay of DCO 260 or 360). The adaptive delay adjustment may be based on various adaptive algorithms such as a least mean square (LMS) algorithm, a least square (LS) algorithm, a minimum mean square error (MMSE) algorithm, etc. These various adaptive algorithms are described by Simon Haykin in a book entitled "Adaptive Filter Theory," 3rd edition, Prentice Hall, 1996. For clarity, adaptive delay adjustment based on the LMS algorithm is described below.

The LMS algorithm may attempt to minimize the mean square error (MSE) of the phase error signal $p_e(t)$, which may be expressed as:

$$E[p_e^2(t)] = E[(p_{ref}(t) - p_{fb}(t,\tau))^2], \quad \text{Eq (5)}$$

where $p_{ref}(t)$ is a reference phase signal, which is the phase of the reference clock, $p_{fb}(t,\tau)$ is the feedback signal from the divider as a function of delay $\tau$, and $E[\ ]$ denotes an expectation operation.

To minimize the MSE, the delay may be adaptively updated as follows:

$$\begin{aligned}\tau(t) &= \tau(t-1) + \Delta\tau(t) \\ &= \tau(t-1) + \mu \cdot f_{ms}(t) \cdot p_e(t)\end{aligned} \quad \text{Eq (6)}$$

where $\mu$ is an adaptation step size, $\Delta\tau(t)$ is a delay update value for sample period t, and $\tau(t)$ is the delay for sample period t.

A larger adaptation step size may result in faster convergence of the delay $\tau(t)$ to its final value but may also result in more jitter. Conversely, a smaller adaptation step size may result in slower convergence but less jitter. A suitable adaptation step size may be selected based on a tradeoff between convergence rate and jitter. The adaptation step size may also be varied. For example, a larger adaptation step size may be used for acquisition, and a smaller adaptation step size may be used for tracking after convergence.

As shown in equation (6), the delay $\tau(t)$ may be updated by an amount $\Delta\tau(t)$ that is dependent on the adaptation step size $\mu$, the scaled modulating signal $f_{ms}(t)$, and the phase error signal $p_e(t)$. To avoid multiplication in computing the delay update value, the delay may be adaptively updated as follows:

$$\tau(t) = \tau(t-1) + \mu \cdot \text{sign}[f_{ms}(t)] \cdot p_e(t), \quad \text{Eq (7)}$$

where $\text{sign}[f_{ms}(t)]$ is the sign of the scaled modulating signal. The adaptation step size may be selected to be a power of two. In this case, the delay update value may be obtained by (i) bit shifting $p_e(t)$ by a specific number of bits determined by the adaptation step size and (ii) flipping the sign of the bit-shifted $p_e(t)$ if $f_{ms}(t)$ is less than zero.

The delay $\tau(t)$ may be given in units of sample periods and may be decomposed into an integer portion and a fractional portion. The integer portion of $\tau(t)$ may be obtained with a programmable delay unit that can provide an integer number of sample periods of delay. The factional portion of $\tau(t)$ may be obtained with an interpolator that can provide a delay that is a fraction of one sample period.

For any given delay $\tau$, where $\tau$ may be a positive or negative value, the scaled modulating signal $f_{ms}(t)$ may be delayed by $\tau$ to obtain the delayed modulating signal $f_{md}(t) = f_{ms}(t-\tau)$. The integer portion of $\tau$ may be obtained by selecting a sample in the scaled modulating signal that is closest to $f_{ms}(t-\tau)$. The fractional portion of $\tau$ may be obtained by interpolating two or more samples located on both sides of $f_{ms}(t-\tau)$.

In one design, linear interpolation may be used to obtain a fractional delay. For simplicity, the following description assumes that $-1 \leq \tau(t) \leq 1$ and that three frequency modulation samples $f(t-1)$, $f(t)$ and $f(t+1)$ are available, with $f(t)$ being the current sample, $f(t-1)$ being the prior/older sample, and $f(t+1)$ being the next/future sample. These three samples may be obtained by delaying the scaled modulating signal and using the latest sample of this signal as $f(t+1)$.

Linear interpolation to obtain a fractional delay may be performed as follows:

$$f_{md}(t) = \begin{cases} [1-\tau(t)] \cdot f(t) + \tau(t) \cdot f(t-1) & \text{for } 0 \leq \tau(t) \leq 1 \\ [1+\tau(t)] \cdot f(t) - \tau(t) \cdot f(t+1) & \text{for } -1 \leq \tau(t) < 0. \end{cases} \quad \text{Eq (8)}$$

Figure 5:
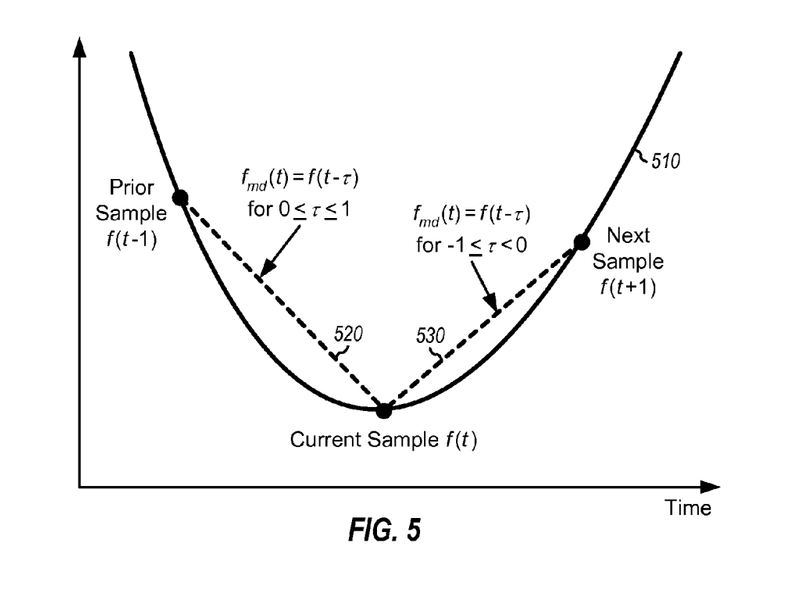
FIG. 5 shows linear interpolation to obtain a fractional delay.

FIG. 5 shows linear interpolation based on equation (8) to obtain a fractional delay. The three frequency modulation samples f(t−1), f(t) and f(t+1) are shown by three dark points and are connected by a best-fit curve 510. A dashed straight line 520 connects the two points for f(t−1) and f(t) and is generated based on the top half of equation (8). Line 520 may be used for linear interpolation when 0≦τ(t)≦1. A dashed straight line 530 connects the two points for f(t) and f(t+1) and is generated based on the bottom half of equation (8). Line 530 may be used for linear interpolation when −1≦τ(t)≦0.

The design in equation (8) uses two multiplications to compute $f_{md}(t)$ for both positive and negative values of τ(t). The number of multiplications may be reduced to one by rearranging the terms in equation (8), as follows:

$$f_{md}(t) = \begin{cases} f(t) + \tau(t) \cdot [f(t-1) - f(t)] & \text{for } 0 \leq \tau(t) \leq 1 \\ f(t) - \tau(t) \cdot [f(t+1) - f(t)] & \text{for } -1 \leq \tau(t) < 0. \end{cases} \quad \text{Eq (9)}$$

Equation (9) is equivalent to equation (8). However, only one multiplication with τ(t) is used to compute $f_{md}(t)$.

Equations (8) and (9) use linear interpolation to obtain a fractional delay. A fractional delay may also be obtained with higher-order interpolation, e.g., quadratic interpolation, spline interpolation, etc.

Figure 6:
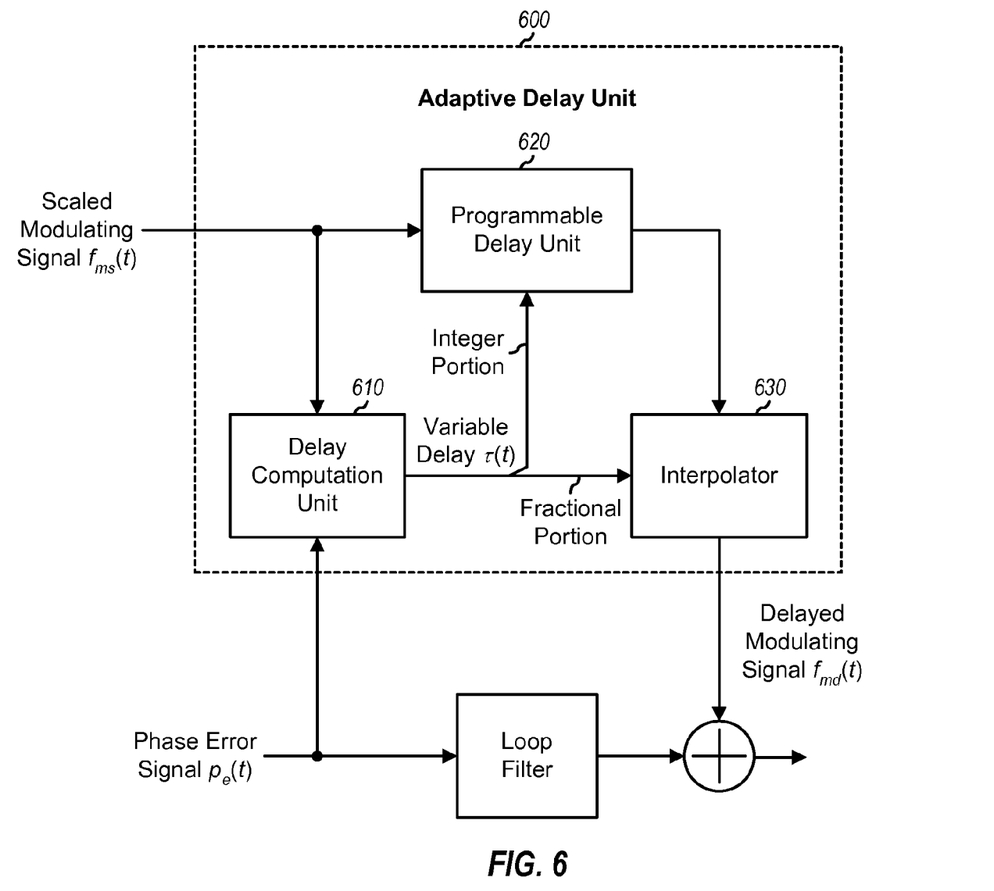
FIG. 6 shows an adaptive delay unit.

FIG. 6 shows a block diagram of a design of an adaptive delay unit 600, which may be used for adaptive delay unit 220 in FIG. 2 and adaptive delay unit 320 in FIG. 3. Within adaptive delay unit 600, a delay computation unit 610 receives the scaled modulating signal $f_{ms}(t)$ and the phase error signal $p_e(t)$ and computes the delay τ(t) for each sample period, e.g., as shown in equation (6) or (7). A programmable delay unit 620 receives the scaled modulating signal and the integer portion of the delay from unit 610 and delays the scaled modulating signal by an integer number of sample periods. An interpolator 630 receives an output signal from programmable delay unit 620 and the fractional portion of the delay from unit 610. Interpolator 630 performs interpolation to obtain the fraction delay, e.g., as shown in equation (8) or (9), and provides the delayed modulating signal $f_{md}(t)$.

Figure 7:
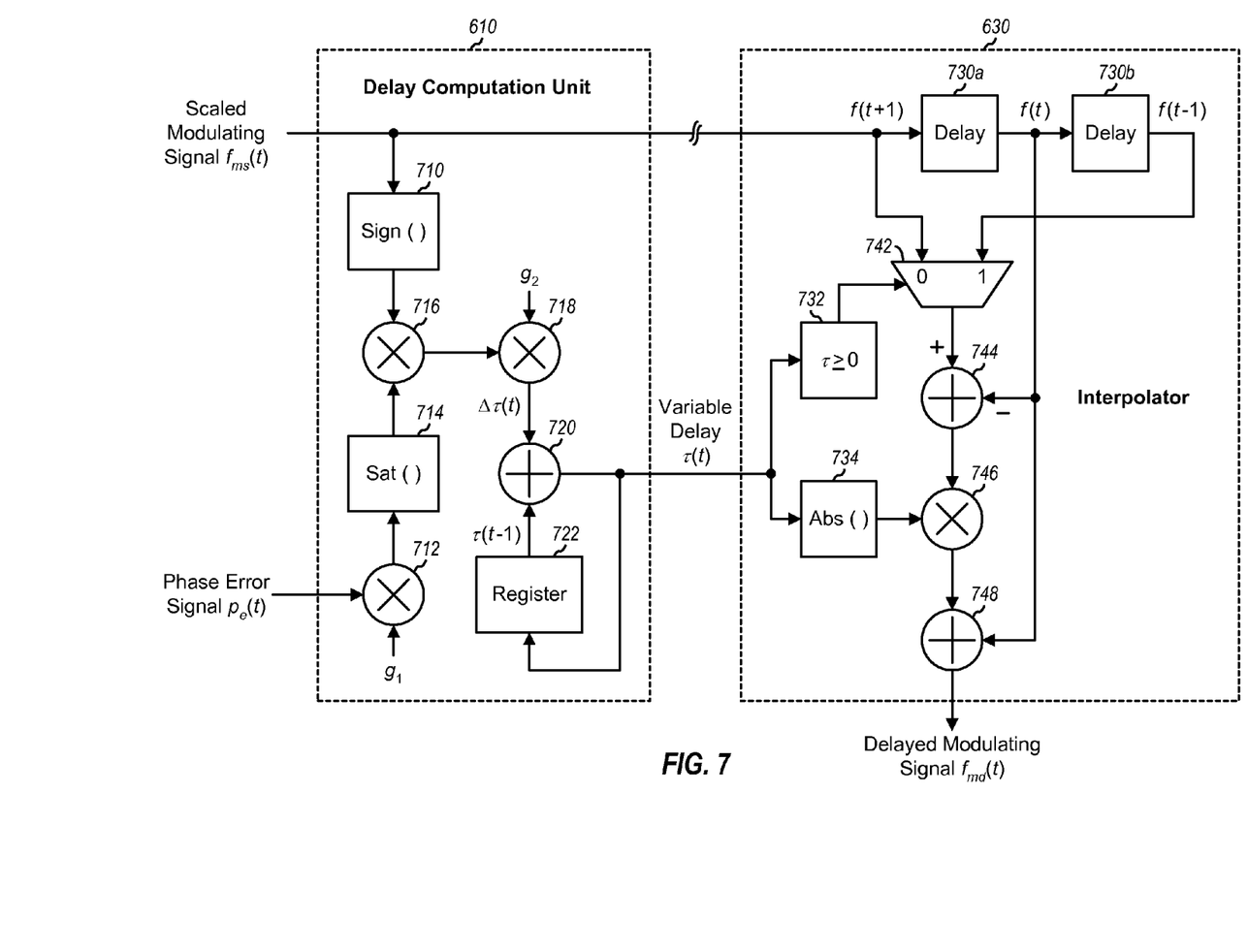
FIG. 7 shows a delay computation unit and an interpolator.

FIG. 7 shows a block diagram of a design of delay computation unit 610 and interpolator 630 in FIG. 6. In this design, delay computation unit 610 implements equation (7). Within delay computation unit 610, a unit 710 receives the scaled modulating signal and provides the sign (e.g., +1 or −1) of this signal in each sample period. A multiplier 712 multiplies the phase error signal with a gain $g_1$, and a unit 714 saturates the output of multiplier 712. A multiplier 716 multiplies the output of unit 714 with the sign of the scaled modulating signal from unit 710. A multiplier 718 multiplies the output of multiplier 716 with a gain $g_2$ and provides a delay update value Δτ(t) in each sample period. A summer 720 sums the prior delay value τ(t−1) with the delay update value and provides a current delay value τ(t) for the current sample period. A register 722 stores the current delay value and provides this value to summer 720 in the next sample period.

In the design shown in FIG. 7, the adaptation step size μ is implemented with two gains $g_1$ and $g_2$, which may simplify hardware while providing the desired resolution. Each gain may be a power of two, and multipliers 712 and 718 may be implemented with bit shifters. Each bit shifter may shift each input value by a specific number of bits determined by the corresponding gain. Multiplier 716 may simply flip the sign of the output of unit 714. Register 722 may have a sufficient number of bits (e.g., more than 10 bits) to accumulate small changes in delay. A predetermined number of most significant bits (MSBs) (e.g., 3 to 5 MSBs) of the output of summer 720 may be provided as the delay τ(t).

In the design shown in FIG. 7, interpolator 630 implements equation (9). Interpolator 630 may receive (i) the scaled modulating signal if adaptive delay unit 600 does not include programmable delay unit 620 or (ii) an intermediate modulating signal from programmable delay unit 620 if it is present. Within interpolator 630, the scaled or intermediate modulating signal is provided to two delay units 730a and 730b coupled in series. Each delay unit 730 provides a delay of one sample period. A unit 732 receives the current delay value τ(t), provides a logic high ('1') if τ(t)≧0, and provides a logic low ('0') otherwise. A multiplexer 742 receives the prior sample f(t−1) and the next sample f(t+1) at two inputs, provides the prior sample if τ(t)≧0, and provides the next sample otherwise. A summer 744 subtracts the current sample f(t) from the output of multiplexer 742 and provides the quantity within square brackets in equation (9). A unit 734 receives the current delay value and provides an absolute delay value |τ(t)|. A multiplier 746 multiplies the absolute delay value with the output of summer 744 and provides a delta value. A summer 748 sums the delta value and sample f(t) and provides a current sample for the delayed modulating signal $f_{md}(t)$.

FIG. 7 shows a specific design of delay computation unit 610 and interpolator 630 based on equations (7) and (9), respectively. Delay computation unit 610 and interpolator 630 may also be implemented in other manners. For example, the delay computation may be based on an adaptive algorithm other than LMS. The interpolation may be based on higher-order interpolation instead of linear interpolation.

Figure 8:
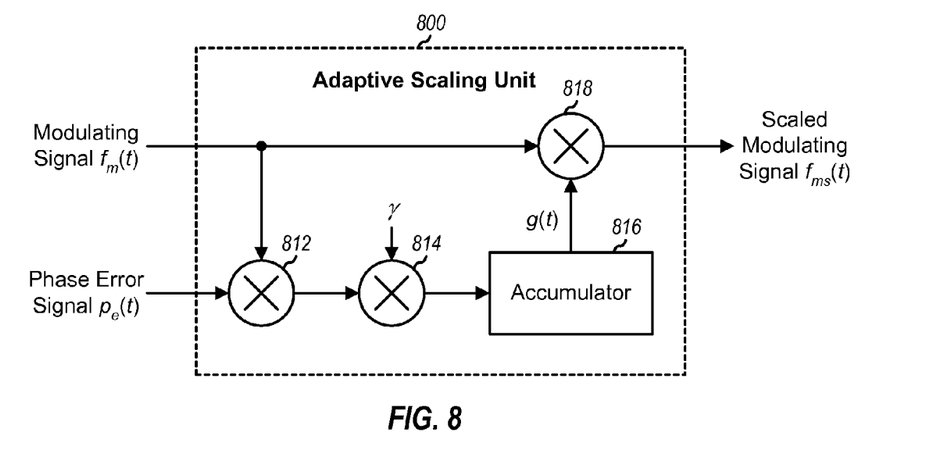
FIG. 8 shows an adaptive scaling unit.

FIG. 8 shows a block diagram of a design of an adaptive scaling unit 800, which may be used for adaptive scaling unit 210 in FIG. 2 and adaptive scaling unit 310 in FIG. 3. In this design, the gain g(t) for the highpass modulation path may be adaptively determined based on the modulating signal $f_m(t)$ and the phase error signal $p_e(t)$ in accordance with an LMS algorithm, as follows:

$$g(t) = g(t-1) + \gamma \cdot f_m(t) \cdot p_e(t), \quad \text{Eq (10)}$$

where γ is an adaptation factor that determines the rate of convergence of the gain to a final value. The computation of the gain g(t) based on the LMS algorithm is described in further detail in U.S. Pat. No. 6,909,331, entitled "PHASE LOCKED LOOP HAVING A FORWARD GAIN ADAPTATION MODULE," issued Jun. 21, 2005.

Within adaptive scaling unit 800, a multiplier 812 multiplies the modulating signal with the phase error signal. A multiplier 814 scales the output of multiplier 812 with the adaptation factor γ. An accumulator 816 accumulates the output of multiplier 814 and provides the gain g(t). A multiplier 818 multiplies the modulating signal with the gain and provides the scaled modulating signal.

In general, an apparatus (e.g., an integrated circuit, a wireless communication device, etc.) may include a DPLL that can perform two-point modulation via first and second modulation paths and can adaptively adjust the delay of the first modulation path to match the delay of the second modulation path. One of the first and second modulation paths may be a highpass modulation path that supports wideband modulation of the frequency of an oscillator. The other one of the first and second modulation paths may be a lowpass modulation path that supports narrowband modulation of the frequency of the oscillator. In one design, the DPLL may adaptively adjust the delay of the highpass modulation path, e.g., as shown in FIGS. 2 and 3. In another design, the DPLL may adaptively adjust the delay of the lowpass modulation path.

The DPLL may include an adaptive delay unit that can provide a variable delay for the first modulation path. In one design, the adaptive delay unit may include a delay computation unit, an interpolator, and a programmable delay unit, e.g., as shown in FIG. 6. The delay computation unit may determine the variable delay based on a modulating signal applied to the first and second modulation paths and a phase error signal in the DPLL, e.g., as shown in equation (6) or (7). In one design, the delay computation unit may determine a delay update value based on the phase error signal, a sign of the modulating signal, and an adaptation step size, e.g., as shown in equation (7). The delay computation unit may then update the variable delay with the delay update value. The adaptive delay unit may determine the variable delay in accordance with an LMS algorithm (as described above), an LS algorithm, an MMSE algorithm, etc.

The interpolator may provide a fractional portion of the variable delay, with the fractional portion being between −1 sample period and +1 sample period. In one design, the interpolator may perform linear interpolation based on (i) a current sample and a prior sample for a positive fractional delay or (ii) the current sample and a future sample for a negative fractional delay, e.g., as shown in equation (8) or (9). The programmable delay unit may provide an integer portion of the variable delay, with the integer portion comprising an integer number of sample periods.

The DPLL may further include an adaptive scaling unit that can provide a variable gain for the highpass modulation path to match the gain of the lowpass modulation path. The adaptive scaling unit may determine the variable gain based on the modulating signal and the phase error signal in the DPLL, e.g., as shown in equation (10).

Two-point modulation may be implemented with various designs. The highpass modulation path may include a scaling unit that scales the modulating signal and provides a scaled modulating signal, e.g., as shown in FIGS. 2 and 3. In one design, the lowpass modulation path may include a delta-sigma modulator that receives the modulating signal and provides an output signal used to vary a frequency divider ratio in the DPLL, e.g., as shown in FIG. 2. In another design, the lowpass modulation path may include an accumulator that accumulates the modulating signal and provides a modulating phase signal, e.g., as shown in FIG. 3. Two-point modulation may also be implemented with other designs.

Figure 9:
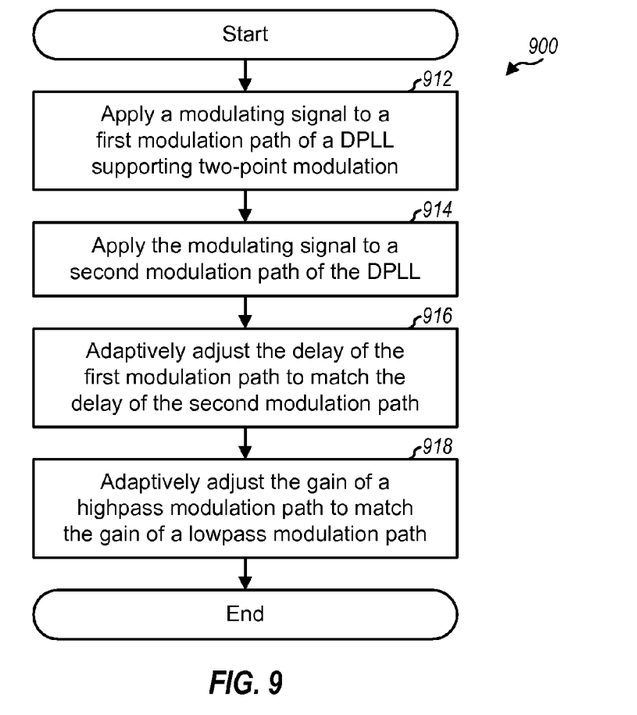
FIG. 9 shows a process for performing two-point modulation with adaptive delay matching.

FIG. 9 shows a design of a process 900 for performing two-point modulation with adaptive delay matching. A modulating signal may be applied to a first modulation path of a DPLL supporting two-point modulation (block 912). The modulating signal may also be applied to a second modulation path of the DPLL (block 914). The delay of the first modulation path may be adaptively adjusted to match the delay of the second modulation path (block 916). The first and second modulation paths may be highpass and lowpass modulation paths, respectively, or may be lowpass and highpass modulation paths, respectively. The gain of the highpass modulation path may be adaptively adjusted to match the gain of the lowpass modulation path (block 918).

In one design of block 916, a variable delay for the first modulation path may be determined based on the modulating signal and a phase error signal in the DPLL. In one design, a delay update value may be determined based on the phase error signal, a sign of the modulating signal, and an adaptation step size, e.g., as shown in equation (7). The variable delay may then be updated with the delay update value. The fractional portion of the variable delay may be provided with interpolation. The integer portion of the variable delay may be provided with a programmable delay unit.

The DPLL with two-point modulation and adaptive delay matching described herein may be used for various applications such as communication, computing, networking, personal electronics, etc. For example, the DPLL may be used in wireless communication devices, cellular phones, personal digital assistants (PDAs), handheld devices, gaming devices, computing devices, laptop computers, consumer electronics devices, personal computers, cordless phones, etc. An exemplary use of the DPLL in a wireless communication device is described below.

Figure 10:
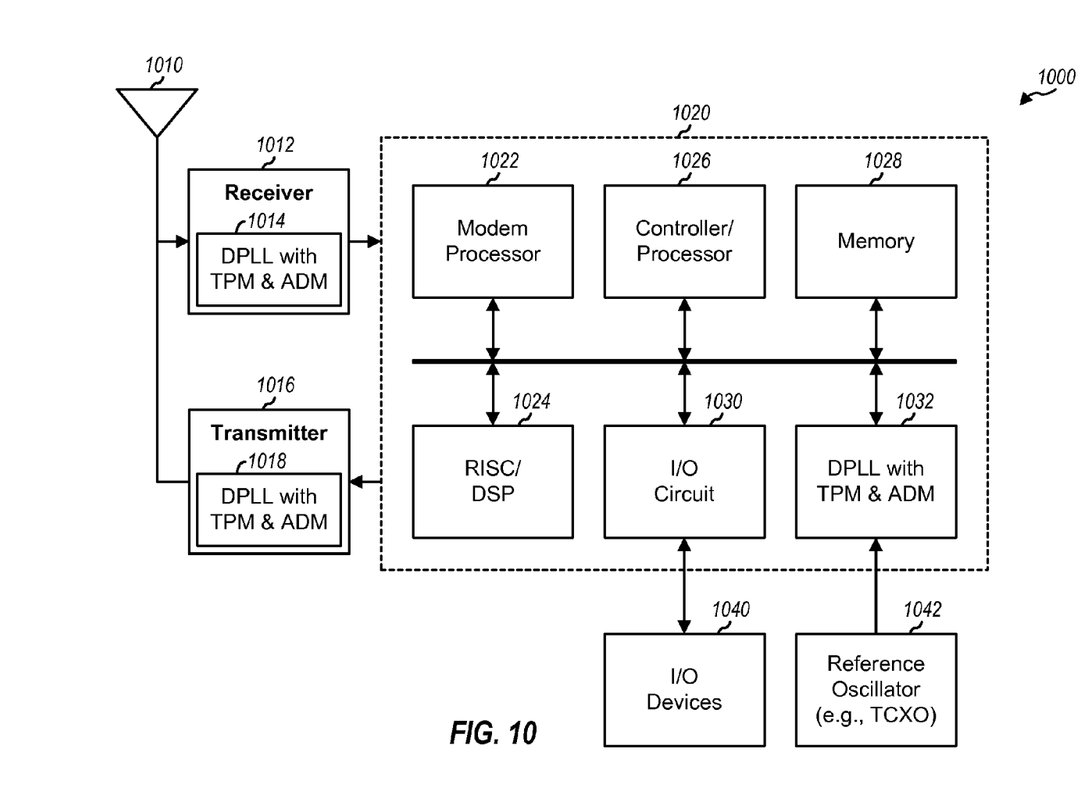
FIG. 10 shows a block diagram of a wireless communication device.

FIG. 10 shows a block diagram of a design of a wireless communication device 1000 for a wireless communication system. Wireless device 1000 may be a cellular phone, a terminal, a handset, a wireless modem, etc. The wireless communication system may be a Code Division Multiple Access (CDMA) system, a Global System for Mobile Communications (GSM) system, an Orthogonal Frequency Division Multiple Access (OFDMA) system, etc.

Wireless device 1000 is capable of providing bi-directional communication via a receive path and a transmit path. In the receive path, signals transmitted by base stations (not shown) are received by an antenna 1010 and provided to a receiver 1012. Receiver 1012 conditions and digitizes the received signal and provides samples to a module 1020 for further processing. In the transmit path, a transmitter 1016 receives data to be transmitted from module 1020, processes and conditions the data, and generates a modulated signal, which is transmitted via antenna 1010 to the base stations. Receiver 1012 and transmitter 1016 may support CDMA, GSM, OFDMA, etc.

Module 1020 includes various processing, interface, and memory units such as, for example, a modem processor 1022, a reduced instruction set computer/digital signal processor (RISC/DSP) 1024, a controller/processor 1026, a memory 1028, an input/output (I/O) circuit 1030, and a DPLL 1032. Modem processor 1022 may perform processing for data transmission and reception, e.g., encoding, modulation, demodulation, decoding, etc. RISC/DSP 1024 may perform general and specialized processing for wireless device 1000. Controller/processor 1026 may direct the operation of various units within module 1020. Memory 1028 may store data and/or instructions for various units within module 1020. I/O circuit 1030 may communicate with external I/O devices 1040. DPLL 1032 may generate clocks for the processing units within module 1020.

A DPLL 1014 may generate a receive local oscillator (LO) signal used by receiver 1012 for frequency downconversion and/or demodulation. A DPLL 1018 may generate a transmit LO signal used by transmitter 1016 for frequency upconversion and/or modulation. DPLL 1014 and/or 1018 may be implemented with DPLL 200 in FIG. 2, DPLL 300 in FIG. 3, or some other DPLL with two-point modulation (TPM) and adaptive delay matching (ADM). A reference oscillator 1042 may generate an accurate reference clock for DPLL 1014, 1018 and/or 1032. Reference oscillator 1042 may be an XO, a VCXO, a TCXO, etc.

The DPLL with two-point modulation and adaptive delay matching described herein may be implemented on an integrated circuit (IC), an analog IC, a radio frequency IC (RFIC), a mixed-signal IC, an application specific integrated circuit (ASIC), a printed circuit board (PCB), an electronics device, etc. The DPLL may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), etc.

An apparatus implementing the DPLL described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a digital phase-locked loop (DPLL) configured to perform two-point modulation via first and second modulation paths and to adaptively adjust delay of the first modulation path to match delay of the second modulation path.

2. The apparatus of claim 1, wherein the DPLL comprises an adaptive delay unit configured to provide a variable delay for the first modulation path.

3. The apparatus of claim 2, wherein the adaptive delay unit comprises
   a delay computation unit configured to determine the variable delay based on a modulating signal applied to the first and second modulation paths.

4. The apparatus of claim 3, wherein the delay computation unit determines the variable delay based further on a phase error signal in the DPLL.

5. The apparatus of claim 4, wherein the delay computation unit determines a delay update value based on the phase error signal, a sign of the modulating signal, and an adaptation step size, and updates the variable delay with the delay update value.

6. The apparatus of claim 2, wherein the adaptive delay unit determines the variable delay in accordance with a least mean square (LMS) algorithm, a least square (LS) algorithm, or a minimum mean square error (MMSE) algorithm.

7. The apparatus of claim 2, wherein the adaptive delay unit comprises
   an interpolator configured to provide a fractional portion of the variable delay, the fractional portion being between minus one sample period and plus one sample period.

8. The apparatus of claim 7, wherein the interpolator performs linear interpolation based on a current sample and a prior sample for a positive fractional delay and based on the current sample and a future sample for a negative fractional delay.

9. The apparatus of claim 2, wherein the adaptive delay unit comprises
   a programmable delay unit configured to provide an integer portion of the variable delay, the integer portion comprising an integer number of sample periods.

10. The apparatus of claim 1, wherein the first modulation path is a highpass modulation path and the second modulation path is a lowpass modulation path, and wherein the DPLL adaptively adjusts the delay of the highpass modulation path.

11. The apparatus of claim 1, wherein the first modulation path is a lowpass modulation path and the second modulation path is a highpass modulation path, and wherein the DPLL adaptively adjusts the delay of the lowpass modulation path.

12. The apparatus of claim 1, wherein one of the first and second modulation paths is a highpass modulation path, and wherein the other one of the first and second modulation paths is a lowpass modulation path.

13. The apparatus of claim 12, wherein the DPLL comprises
   an adaptive scaling unit configured to provide a variable gain for the highpass modulation path to match gain of the lowpass modulation path.

14. The apparatus of claim 13, wherein the adaptive scaling unit determines the variable gain based on a modulating signal applied to the highpass and lowpass modulation paths and a phase error signal in the DPLL.

15. The apparatus of claim 12, wherein the highpass modulation path comprises a scaling unit configured to scale a modulating signal and provide a scaled modulating signal, and wherein the lowpass modulation path comprises a delta-sigma modulator configured to receive the modulating signal and provide an output signal used to vary a frequency divider factor in the DPLL.

16. The apparatus of claim 12, wherein the highpass modulation path comprises a scaling unit configured to scale a modulating signal and provide a scaled modulating signal, and wherein the lowpass modulation path comprises an accumulator configured to accumulate the modulating signal and provide a modulating phase signal.

17. The apparatus of claim 1, wherein the apparatus is an integrated circuit.

18. The apparatus of claim 1, wherein the apparatus is a wireless communication device.

19. An apparatus comprising:
a processor configured to perform two-point modulation via first and second modulation paths of a digital phase-locked loop (DPLL) and to adaptively adjust delay of the first modulation path to match delay of the second modulation path.

20. A method comprising:
applying a modulating signal to a first modulation path of a digital phase-locked loop (DPLL) supporting two-point modulation;
applying the modulating signal to a second modulation path of the DPLL; and
adaptively adjusting delay of the first modulation path to match delay of the second modulation path.

21. The method of claim 20, wherein the adaptively adjusting delay of the first modulation path comprises
determining a variable delay for the first modulation path based on the modulating signal and a phase error signal in the DPLL.

22. The method of claim 21, wherein the determining the variable delay comprises
determining a delay update value based on the phase error signal, a sign of the modulating signal, and an adaptation step size, and
updating the variable delay with the delay update value.

23. The method of claim 21, wherein the adaptively adjusting delay of the first modulation path comprises
providing a fractional portion of the variable delay with interpolation, the fractional portion being between minus one sample period and plus one sample period.

24. The method of claim 21, wherein the adaptively adjusting delay of the first modulation path comprises
providing an integer portion of the variable delay with a programmable delay unit, the integer portion comprising an integer number of sample periods.

25. The method of claim 20, further comprising:
adaptively adjusting gain of a highpass modulation path to match gain of a lowpass modulation path, wherein one of the first and second modulation paths is the highpass modulation path, and wherein the other one of the first and second modulation paths is the lowpass modulation path.

26. An apparatus comprising:
means for applying a modulating signal to a first modulation path of a digital phase-locked loop (DPLL) supporting two-point modulation;
means for applying the modulating signal to a second modulation path of the DPLL; and
means for adaptively adjusting delay of the first modulation path to match delay of the second modulation path.

27. The apparatus of claim 26, wherein the means for adaptively adjusting delay of the first modulation path comprises
means for determining a variable delay for the first modulation path based on the modulating signal and a phase error signal in the DPLL.

28. The apparatus of claim 27, wherein the means for adaptively adjusting delay of the first modulation path comprises
means for providing a fractional portion of the variable delay with interpolation, the fractional portion being between minus one sample period and plus one sample period.

29. The apparatus of claim 26, further comprising:
means for adaptively adjusting gain of a highpass modulation path to match gain of a lowpass modulation path, wherein one of the first and second modulation paths is the highpass modulation path, and wherein the other one of the first and second modulation paths is the lowpass modulation path.

30. A non-transitory computer-readable medium having stored thereon processor-executable software instructions configured to cause a processor to perform operations comprising:
applying a modulating signal to a first modulation path of a digital phase-locked loop (DPLL) supporting two-point modulation;
applying the modulating signal to a second modulation path of the DPLL; and
adaptively adjusting delay of the first modulation path to match delay of the second modulation path.

31. The computer-readable medium of claim 30, wherein the stored processor-executable software instructions are configured to cause a processor to perform further operations comprising:
determining a variable delay for the first modulation path based on the modulating signal and a phase error signal in the DPLL.

32. The computer-readable medium of claim 31, wherein the stored processor-executable software instructions are configured to cause a processor to perform further operations comprising:
providing a fractional portion of the variable delay with interpolation, the fractional portion being between minus one sample period and plus one sample period.

33. The computer-readable medium of claim 30, wherein the stored processor-executable software instructions are configured to cause a processor to perform further operations comprising:
adaptively adjusting gain of a highpass modulation path to match gain of a lowpass modulation path, wherein one of the first and second modulation paths is the highpass modulation path, and wherein the other one of the first and second modulation paths is the lowpass modulation path.

* * * * *